(12) United States Patent
Su et al.

(10) Patent No.: US 9,041,490 B2
(45) Date of Patent: May 26, 2015

(54) DE-NOISE CIRCUIT AND DE-NOISE METHOD FOR DIFFERENTIAL SIGNALS AND CHIP FOR RECEIVING DIFFERENTIAL SIGNALS

(71) Applicant: VIA Technologies, Inc., New Taipei (TW)

(72) Inventors: Chia-Hung Su, New Taipei (TW); Tsung-Hsin Lin, New Taipei (TW); Hung-Yi Kuo, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 208 days.

(21) Appl. No.: 13/645,454

(22) Filed: Oct. 4, 2012

(65) Prior Publication Data

US 2013/0335167 A1    Dec. 19, 2013

(30) Foreign Application Priority Data

Jun. 18, 2012    (TW) .............................. 101121742 A

(51) Int. Cl.
| | |
|---|---|
| *H03H 7/01* | (2006.01) |
| *H03H 7/06* | (2006.01) |
| *H03F 1/30* | (2006.01) |
| *H03F 3/45* | (2006.01) |

(52) U.S. Cl.
CPC . *H03H 7/01* (2013.01); *H03H 7/06* (2013.01); *H03F 1/303* (2013.01); *H03F 3/45475* (2013.01); *H03F 2200/468* (2013.01); *H03F 2203/45544* (2013.01); *H03F 2203/45551* (2013.01); *H03F 2203/45591* (2013.01); *H03F 2203/45594* (2013.01); *H03F 2203/45616* (2013.01); *H03F 2203/45618* (2013.01)

(58) Field of Classification Search
CPC ....... H03F 1/303; H03F 3/45475; H03H 7/06; H03H 7/01
USPC .................................. 333/174, 172, 4, 5, 17.1
See application file for complete search history.

(56) References Cited

U.S. PATENT DOCUMENTS

| | | | |
|---|---|---|---|
| 4,354,250 A | | 10/1982 | Lee |
| 5,050,194 A | * | 9/1991 | Pickering et al. ............. 375/357 |

(Continued)

FOREIGN PATENT DOCUMENTS

| | | |
|---|---|---|
| CN | 101483409 | 7/2009 |
| CN | 101499781 | 8/2009 |
| CN | 101714872 | 5/2010 |

OTHER PUBLICATIONS

"Office Action of Taiwan Counterpart Application", issued on Oct. 23, 2014, p. 1-p. 10.

*Primary Examiner* — Benny Lee
*Assistant Examiner* — Albens Dieujuste
(74) *Attorney, Agent, or Firm* — Jianq Chyun IP Office

(57) ABSTRACT

A de-noise circuit and a de-noise method for differential signals and a chip for receiving differential signals are provided. The de-noise circuit includes a filter and a register. Both the filter and the register are disposed in the chip. The chip receives a differential signal through a first input terminal and a second input terminal. The filter is coupled between the first input terminal and the second input terminal of the chip. The filter filters out noises in the differential signal. The filter includes at least one filter unit. Each filter unit has at least one resistance value or at least one capacitance value. The register is coupled to the filter. The register receives and stores a control value. The register controls the resistance value or the capacitance value of at least one of the filter units based on the control value.

18 Claims, 10 Drawing Sheets

(56) References Cited

U.S. PATENT DOCUMENTS

| | | | |
|---|---|---|---|
| 5,875,142 A * | 2/1999 | Chevallier | 365/212 |
| 6,121,908 A | 9/2000 | Sevastopoulos et al. | |
| 6,424,209 B1 * | 7/2002 | Gorecki et al. | 327/554 |
| 7,113,029 B2 | 9/2006 | Hsieh et al. | |
| 8,044,712 B2 | 10/2011 | Finocchiaro | |
| 2007/0075350 A1 | 4/2007 | Darabi et al. | |

\* cited by examiner

DE-NOISE CIRCUIT AND DE-NOISE METHOD FOR DIFFERENTIAL SIGNALS AND CHIP FOR RECEIVING DIFFERENTIAL SIGNALS

CROSS-REFERENCE TO RELATED APPLICATION

This application claims the priority benefit of Taiwan application serial no. 101121742, filed on Jun. 18, 2012. the entirety of the above-mentioned patent application is hereby incorporated by reference herein and made a part of this specification.

BACKGROUND

1. Technical Field

The invention relates to a de-noise circuit, a de-noise method and a chip. Particularly, the invention relates to a de-noise circuit and a de-noise method for differential signals and a chip for receiving differential signals.

2. Related Art

FIG. 1 is a schematic diagram of a conventional differential amplifier 110 in a chip 100. A differential signal 140 is respectively transmitted to input terminals 121 and 122 of the chip 100 through transmission lines 131 and 132. The chip 100 receives the differential signal 140 through the input terminals 121 and 122. The differential amplifier 110 recognizes the differential signal 140, i.e. converts a potential difference of +/− terminals into a logic signal of 1 or 0 for outputting to a next stage.

The differential signal 140 may contain a variety of noises, for example, a common mode noise, a high frequency noise, an IR drop, an inter-symbol interference (ISI), a signal switching noise (SSN), or a noise caused by a circuit layout of a circuit board. According to the current technique, prevention of the noise within the chip is not considered, and the noises of various sources may occur without warning, which may interfere the recognition of the differential signal 140. When the signal recognition of the differential amplifier 110 is interfered, the output logic signal will probably have an error, which may lead to abnormalities such as loss or error in data transmission of the chip 100, and the whole system may even fail.

SUMMARY

The invention is directed to a de-noise circuit and a de-noise method for differential signals, and a chip for receiving the differential signals, which is capable of filtering out noises contained in the differential signals within the chip.

The invention provides a de-noise circuit for differential signals. The de-noise circuit includes a filter and a register. Both of the filter and the register are disposed in a chip. The chip receives a differential signal through a first input terminal and a second input terminal. The filter is coupled between the first input terminal and the second input terminal of the chip. The filter filters out noises in the differential signal. The filter includes at least one filter unit. Each filter unit has at least one resistance value or at least one capacitance value. The register is coupled to the filter, receives and stores a control value, and controls the resistance value or the capacitance value of at least one filter unit according to the control value.

The invention provides a de-noise method for differential signals, which includes the following steps: A control value is received. The control value is used to control at least one resistance value and/or at least one capacitance value of a filter in a chip. A differential signal is received. The filter is used to filter out noises in the differential signal.

The invention provides a chip for receiving differential signals, which includes a filter and a register. Both the filter and the register are disposed in a chip. The filter receives a differential signal and filters out noises in the differential signal, and the filter controls a filter parameter of the filter according to a control value stored in the register.

According to the above descriptions, the noise contained in the differential signal can be filtered within the chip, so as to improve quality and a recognizability of the input signal to make the system more stable.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
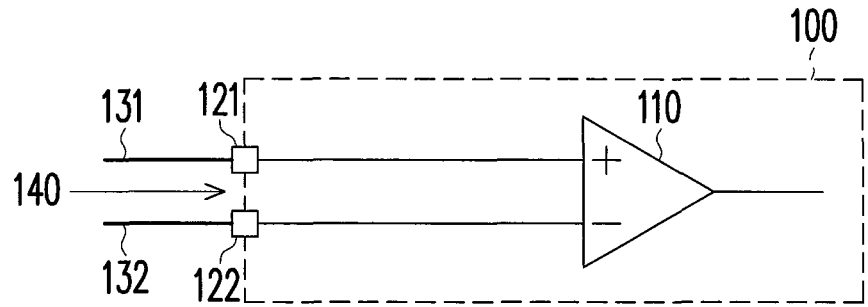
FIG. 1 is a schematic diagram of a conventional differential amplifier in a chip.
Figure 2:
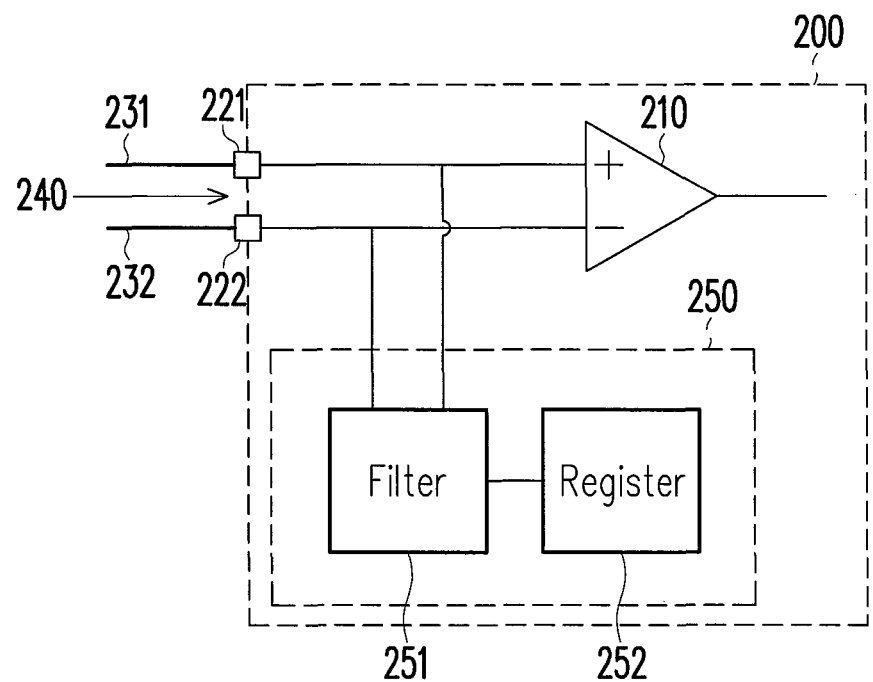
FIG. 2 is a schematic diagram of a de-noise circuit according to an embodiment of the invention.

FIG. 2 is a schematic diagram of a de-noise circuit 250 according to an embodiment of the invention. As shown in FIG. 2, two input terminals 221 and 222 of a chip 200 receive a differential signal 240, and the differential signal 240 is respectively transmitted to the input terminals 221 and 222 through transmission lines 231 and 232. A differential amplifier 210 in the chip 200 is used to recognize the differential signal 240, i.e. convert the differential signal 240 into a logic signal of 1 or 0 for outputting. The de-noise circuit 250 includes a filter 251 and a register 252. In order to dynamically adjust the filter 251 and save cost, both the filter 251 and the register 252 are configured in the chip 200. The filter 251 is coupled between the input terminals 221 and 222 of the chip 200, and the register 252 is coupled to the filter 251.

The filter 251 includes at least one filter unit. Each filter unit is mainly composed of resistors or capacitors, so that each filter unit has at least one resistance value or at least one capacitance value. The filter 251 receives the differential signal 240. Regardless of a + terminal or a − terminal, when the differential signal 240 contains noises, the resistors and/or the capacitors in the filter 251 may filter out the noises of different sources in the differential signal 240.

The register 252 receives and stores a control value, and controls the resistance value or the capacitance value of at least one filter unit in the filter 251 according to the control value. For example, the control value can be used to adjust an input impedance of the filter 251 at the input terminal 221 to be equal to an impedance of the transmission line 231, and adjust an input impedance of the filter 251 at the input terminal 222 to be equal to an impedance of the transmission line 232, so as to improve the quality of the received differential signal 240. The control value can also be used to adjust the resistance value and/or the capacitance value of the filter 251 to enlarge an application range of the de-noise circuit 250.

Each filter unit of the filter 251 can be a resistor unit or a capacitor unit. Each resistor unit can be as that shown in FIG. 3A, FIG. 3B or FIG. 3C, and each capacitor unit can be as that shown in FIG. 4A, FIG. 4B or FIG. 4C.

Figure 3A:
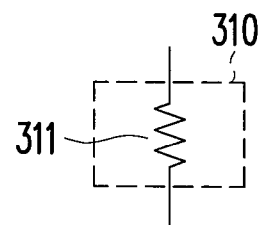
FIG. 3A-FIG. 3C are schematic diagrams of a plurality of resistor units according to an embodiment of the invention.

A resistor unit 310 of FIG. 3A includes a resistor 311, and the resistance value of the resistor unit 310 is the resistance value of the resistor 311.

Figure 3B:
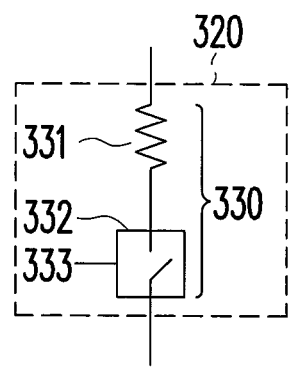

A resistor unit 320 of FIG. 3B includes a resistance branch circuit 330, and the resistance branch circuit 330 includes a resistor 331 and a switch 332 connected in series. The switch 332 is turned on or turned off under control of a control signal 333. When the switch 332 is turned on, the resistor 331 is enabled, and now the resistance value of the resistor unit 320 is the resistance value of the resistor 331.

Figure 3C:
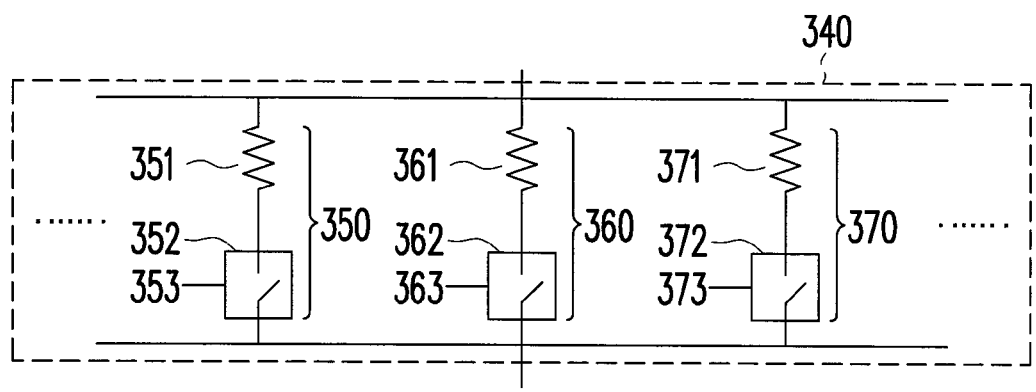

A resistor unit 340 of FIG. 3C includes a plurality of resistance branch circuits, for example, resistance branch circuits 350, 360 and 370. Each of the resistance branch circuits includes a resistor and a switch connected in series. For example, the resistance branch circuit 350 includes a resistor 351 and a switch 352 connected in series, the resistance branch circuit 360 includes a resistor 361 and a switch 362 connected in series, and the resistance branch circuit 370 includes a resistor 371 and a switch 372 connected in series. Each of the switches is turned on or turned off under control of a corresponding control signal, and the switches 352, 362 and 372 respectively correspond to control signals 353, 363 and 373. When one switch is turned on, the resistor connected in series with the switch is enabled, and the resistance value of the resistor unit 340 is an equivalent resistance value formed by all of the enabled resistors connected in parallel in the resistor unit 340. Whether each switch is turned on or turned off is controlled by the chip 200, and the chip 200 can dynamically control the turn on/off state of the switch according to different situations.

Each of the aforementioned switches can be implemented by a metal-oxide-semiconductor field-effect transistor (MOSFET), and the corresponding control signal can be coupled to a gate of the MOSFET to control the turn on/off state of the switch. The control signal of each of the switches is one bit of the control value stored in the register 252. Namely, each bit of the control value controls the turn on/off state of one of the switches in the resistor unit, and the control value controls the resistance values of one or a plurality of resistor units in the filter 251.

Figure 4A:
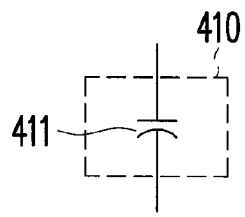
FIG. 4A-FIG. 4C are schematic diagrams of a plurality of capacitor units according to an embodiment of the invention.

A capacitor unit 410 of FIG. 4A includes a capacitor 411, and the capacitance value of the capacitor unit 410 is the capacitance value of the capacitor 411.

Figure 4B:
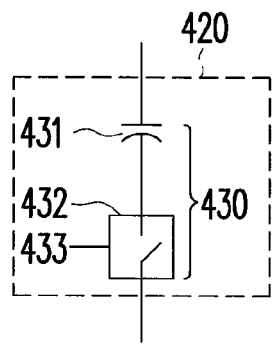

A capacitor unit 420 of FIG. 4B includes a capacitance branch circuit 430, and the capacitance branch circuit 430 includes a capacitor 431 and a switch 432 connected in series. The switch 432 is turned on or turned off under control of a control signal 433. When the switch 432 is turned on, the capacitor 431 is enabled, and now the capacitance value of the capacitor unit 420 is the capacitance value of the capacitor 431.

Figure 4C:
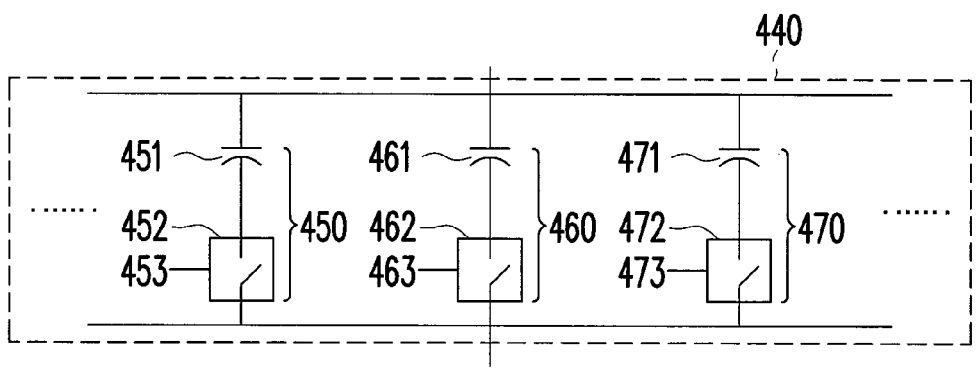

A capacitor unit 440 of FIG. 4C includes a plurality of capacitance branch circuits, for example, capacitance branch circuits 450, 460 and 470. Each of the capacitance branch circuits includes a capacitor and a switch connected in series. For example, the capacitance branch circuit 450 includes a capacitor 451 and a switch 452 connected in series, the capacitance branch circuit 460 includes a capacitor 461 and a switch 462 connected in series, and the capacitance branch circuit 470 includes a capacitor 471 and a switch 472 connected in series. Each of the switches is turned on or turned off under control of a corresponding control signal, and the switches 452, 462 and 472 respectively correspond to control signals 453, 463 and 473. When one switch is turned on, the capacitor connected in series with the switch is enabled, and the capacitance value of the capacitor unit 440 is an equivalent capacitance value formed by all of the enabled capacitors connected in parallel in the capacitor unit 440. Whether each switch is turned on or turned off is controlled by the chip 200, and the chip 200 can dynamically control a turn on/off state of the switch according to different situations.

Each of the aforementioned capacitors can be implemented by a capacitor of an MOSFET or a capacitor between MOSFETs. The control signal of each of the switches is one bit of the control value stored in the register 252. Namely, each bit of the control value controls the turn on/off state of one of the switches in the capacitor unit, and the control value controls the capacitance values of one or a plurality of capacitor units in the filter 251.

Figure 5A:
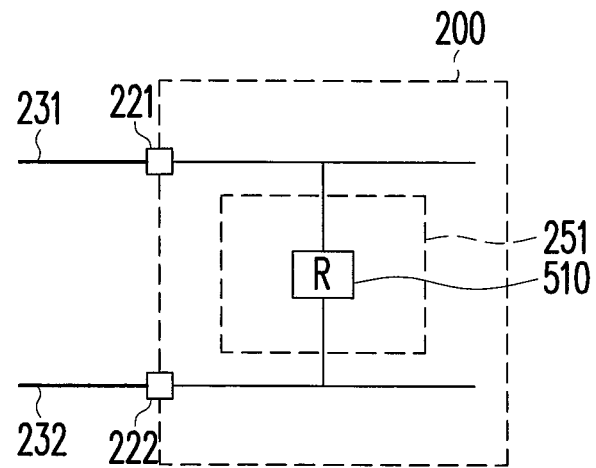
FIG. 5A-5B are schematic diagrams of a filter containing a filter unit, coupled between input terminals of a chip according to an embodiment of the invention.

FIG. 5A is a schematic diagram of the filter 251 according to an embodiment of the invention. As shown in FIG. 5A, the filter 251 includes a filter unit 510, where the filter unit 510 is coupled between the input terminals 221 and 222 of the chip 200. "R" shown on the filter unit 510 represents that the filter unit 510 is a resistor unit, and the filter unit 510 may use the circuit structure shown in FIG. 3A, FIG. 3B or FIG. 3C.

Figure 5B:
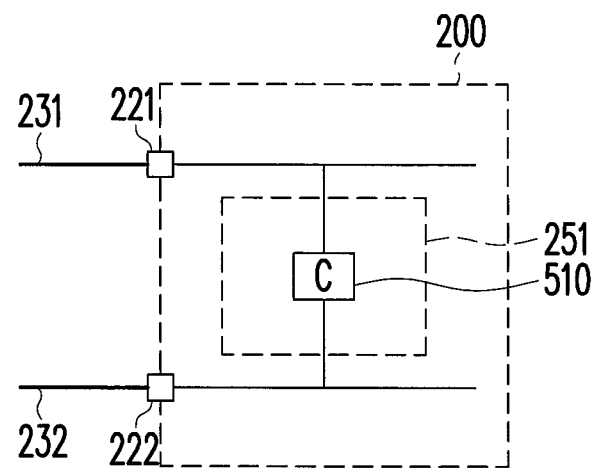

FIG. 5B is a schematic diagram of the filter 251 according to another embodiment of the invention. "C" shown on the filter unit 510 represents that the filter unit 510 is a capacitor unit, and the filter unit 510 of FIG. 5B may use the circuit structure shown in FIG. 4A, FIG. 4B or FIG. 4C.

Figure 6A:
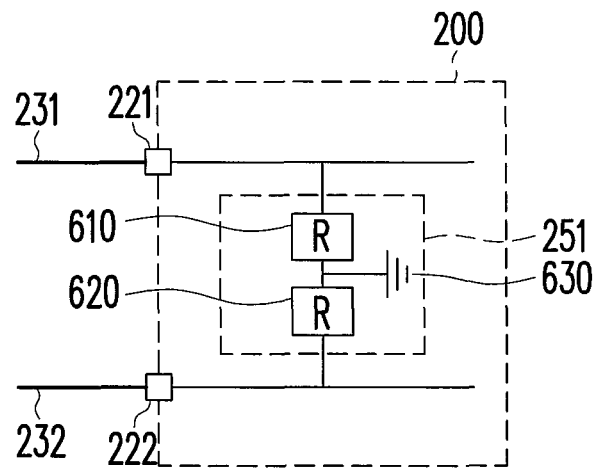
FIG. 6A-6B are schematic diagrams of a filter containing multiple filter units coupled between an input terminal of a chip and a ground terminal, according to another embodiment of the invention.

FIG. 6A is a schematic diagram of the filter 251 according to another embodiment of the invention. As shown in FIG. 6A, the filter 251 includes filter units 610 and 620. The filter unit 610 is coupled between the input terminal 221 of the chip 200 and a ground terminal 630. The filter unit 620 is coupled between the other input terminal 222 of the chip 200 and the ground terminal 630. The filter units 610 and 620 of FIG. 6A are all resistor units, which may use the circuit structure shown in FIG. 3A, FIG. 3B or FIG. 3C.

Figure 6B:
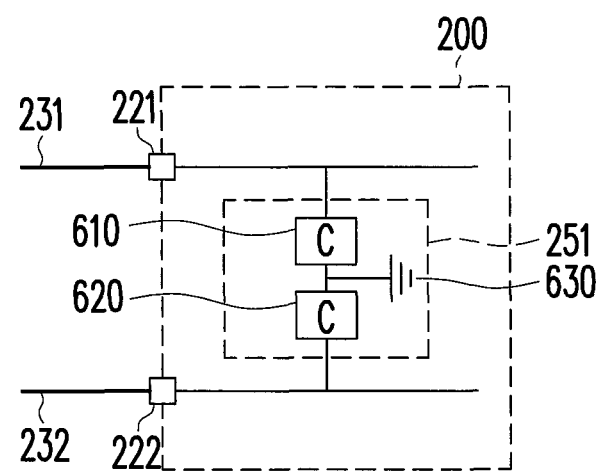

FIG. 6B is a schematic diagram of the filter 251 according to another embodiment of the invention. In the embodiment of FIG. 6B, the filter units 610 and 620 of FIG. 6A are all replaced by capacitor units. The filter units 610 and 620 of FIG. 6B may use the circuit structure shown in FIG. 4A, FIG. 4B or FIG. 4C.

Figure 7A:
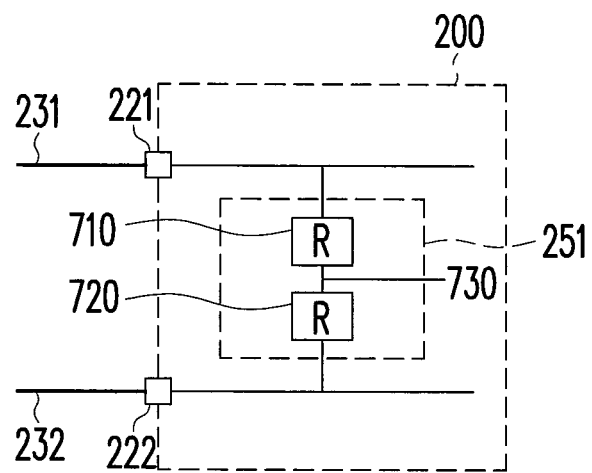
FIG. 7A-7B are schematic diagrams of a filter containing multiple filter units coupled between an input terminal of a chip and a reference voltage, according to another embodiment of the invention.

FIG. 7A is a schematic diagram of the filter 251 according to another embodiment of the invention. As shown in FIG. 7A, the filter 251 includes filter units 710 and 720. The filter unit 710 is coupled between the input terminal 221 of the chip 200 and a reference voltage 730. The filter unit 720 is coupled between the other input terminal 222 of the chip 200 and the reference voltage 730. The filter units 710 and 720 of FIG. 7A are all resistor units, which may use the circuit structure shown in FIG. 3A, FIG. 3B or FIG. 3C.

Figure 7B:
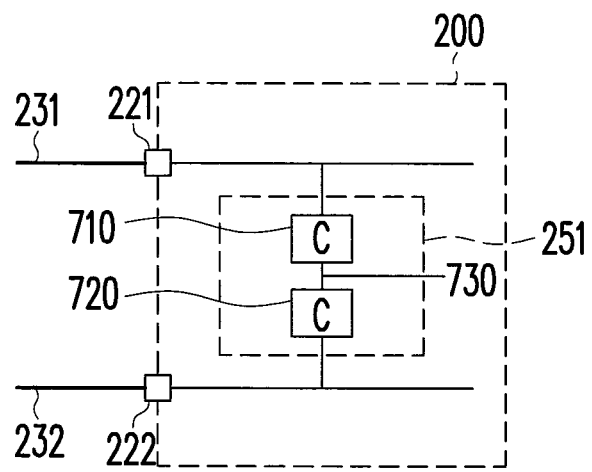

FIG. 7B is a schematic diagram of the filter 251 according to another embodiment of the invention. In the embodiment of FIG. 7B, the filter units 710 and 720 of FIG. 7A are all replaced by capacitor units. The filter units 710 and 720 of FIG. 7B may use the circuit structure shown in FIG. 4A, FIG. 4B or FIG. 4C.

Figure 8A:
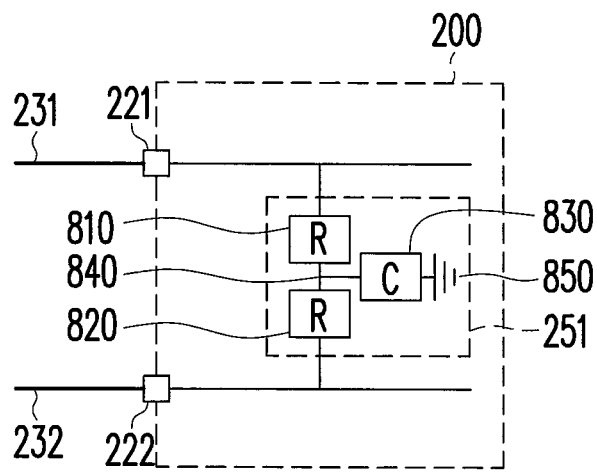
FIG. 8A-8D are schematic diagrams of a filter containing multiple filter units coupled between an input terminal of a chip and a node, according to another embodiment of the invention.

FIG. 8A is a schematic diagram of the filter 251 according to another embodiment of the invention. As shown in FIG. 8A, the filter 251 includes filter units 810, 820 and 830. The filter unit 810 is coupled between the input terminal 221 of the chip 200 and a node 840. The filter unit 820 is coupled between the other input terminal 222 of the chip 200 and the node 840. The filter unit 830 is coupled between the node 840 and a ground terminal 850. The filter units 810 and 820 of FIG. 8A are all resistor units, which may use the circuit structure shown in FIG. 3A, FIG. 3B or FIG. 3C. The filter unit 830 of FIG. 8A is a capacitor unit, which may use the circuit structure shown in FIG. 4A, FIG. 4B or FIG. 4C.

The control value stored in the register 252 can be used to control the resistance values of the filter units 810 and 820, by which the resistance value of the filter unit 810 is equal to the resistance value of the transmission line 231, and the resistance value of the filter unit 820 is equal to the resistance value of the transmission line 232. In this way, the quality of the received differential signal 240 is improved.

Figure 8B:
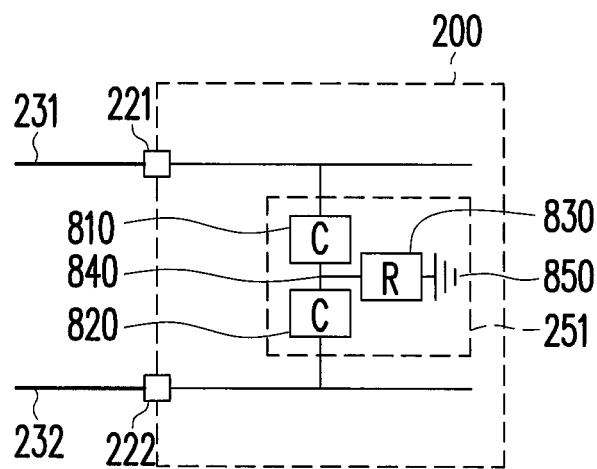

FIG. 8B is a schematic diagram of the filter 251 according to another embodiment of the invention. In the embodiment of FIG. 8B, the filter units 810 and 820 of FIG. 8A are all replaced by capacitor units, and the filter unit 830 of FIG. 8A is replaced by a resistor unit. The filter units 810 and 820 of FIG. 8B may use the circuit structure shown in FIG. 4A, FIG. 4B or FIG. 4C, and the filter unit 830 of FIG. 8B may use the circuit structure shown in FIG. 3A, FIG. 3B or FIG. 3C.

Figure 8C:
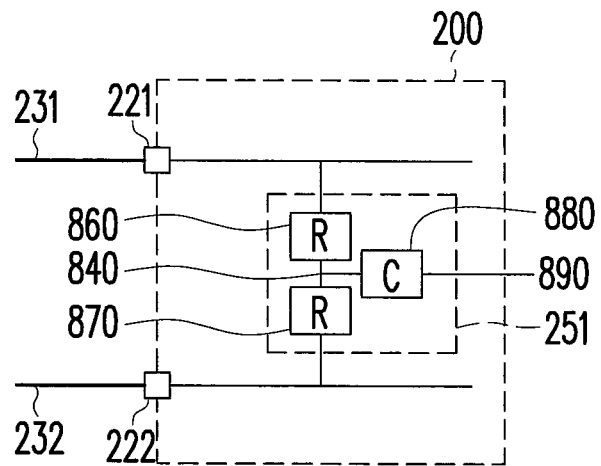

FIG. 8C is a schematic diagram of the filter 251 according to another embodiment of the invention. As shown in FIG. 8C, the filter 251 includes filter units 860, 870 and 880. The filter unit 860 is coupled between the input terminal 221 of the chip 200 and the node 840. The filter unit 870 is coupled between the other input terminal 222 of the chip 200 and the node 840. The filter unit 880 is coupled between the node 840 and a reference voltage 890. The filter units 860 and 870 of FIG. 8C are all resistor units, which may use the circuit structure shown in FIG. 3A, FIG. 3B or FIG. 3C. The filter unit 880 of FIG. 8C is a capacitor unit, which may use the circuit structure shown in FIG. 4A, FIG. 4B or FIG. 4C.

The control value stored in the register 252 can be used to control the resistance values of the filter units 810 and 820, by which the resistance value of the filter unit 860 is equal to the resistance value of the transmission line 231, and the resistance value of the filter unit 870 is equal to the resistance value of the transmission line 232. In this way, the quality of the received differential signal 240 is improved.

Figure 8D:
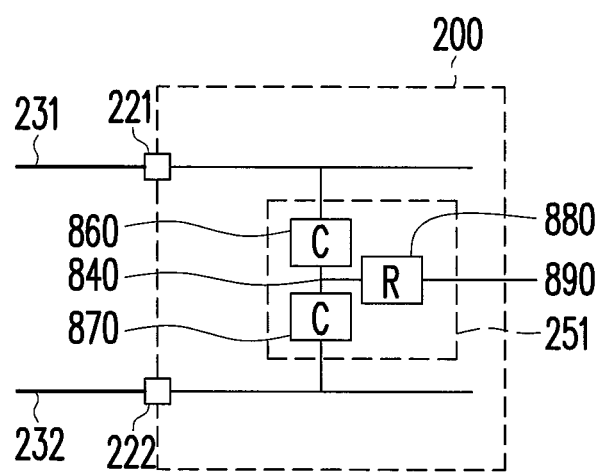

FIG. 8D is a schematic diagram of the filter 251 according to another embodiment of the invention. In the embodiment of FIG. 8D, the filter units 860 and 870 of FIG. 8C are all replaced by capacitor units, and the filter unit 880 of FIG. 8C is replaced by a resistor unit. The filter units 860 and 870 of FIG. 8D may use the circuit structure shown in FIG. 4A, FIG. 4B or FIG. 4C, and the filter unit 880 of FIG. 8D may use the circuit structure shown in FIG. 3A, FIG. 3B or FIG. 3C.

It should be noticed that the filter structures shown in FIGS. 3A-3C, 4A-4C, 5A-5B, 6A-6B, 7A-7B and 8A-8D are only examples. The resistors and capacitors of FIGS. 3A-3C and FIGS. 4A-4C can be referred to as filter devices. Actually, besides the aforementioned resistors and capacitors, any filter device capable of providing a noise-filtering effect of the differential signal can be used to implement the filters 251. Moreover, the filters of the FIGS. 3A-3C, 4A-4C, 5A-5B, 6A-6B, 7A-7B and 8A-8D all provide adjustable filter parameters (for example, the resistance values, the capacitance values, or a combination of the resistance values and the capacitance values) for dynamic adjustment in actual applications, and any adjustable value used to filter the noise of the differential signal can be used in the invention to serve as the filter parameter, which can be modified by those skilled in the art according to the actual applications, though the equivalent modifications performed based on the concept of the invention are still within the scope of the invention.

Figure 9:
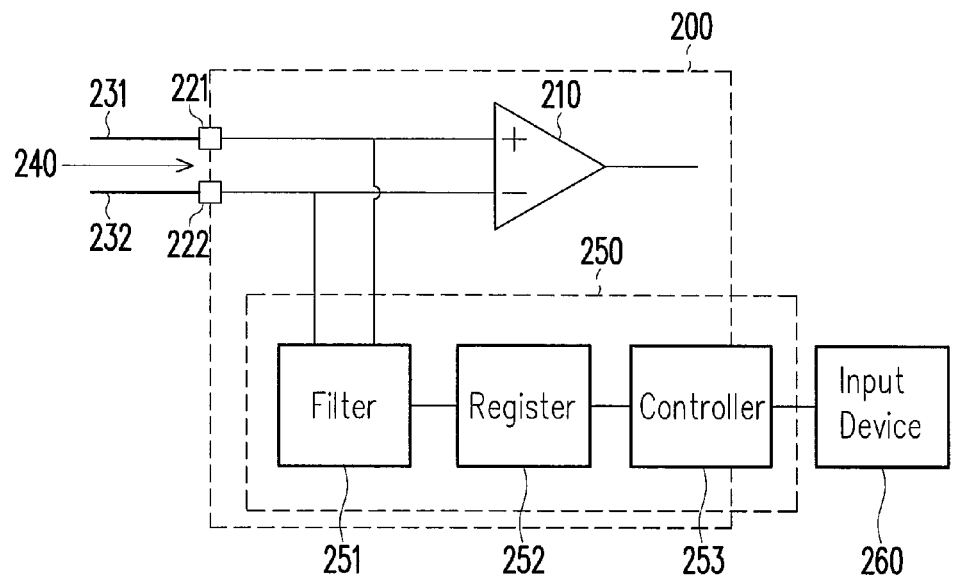
FIG. 9 and FIG. 10 are schematic diagrams of two de-noise circuits according to different embodiments of the invention.

FIG. 9 is a schematic diagram of the de-noise circuit 250 according to another embodiment of the invention. The de-noise circuit 250 of FIG. 9 is a variation of the de-noise circuit 250 of FIG. 2, and besides the filter 251 and the register 252, the de-noise circuit 250 further includes a controller 253. The controller 253 can be disposed in the internal of the chip 200 or disposed at the external of the chip 200. The controller 253 is coupled to the register 252 and an input device 260, and converts one or a plurality of input signals from the input device 260 into the aforementioned control value, and transmits the control value to the register 252 for storage. Namely, the controller 253 converts an input operation performed on the input device 260 by the user into the control value stored in the register 252. The input device 260 can be a keyboard or a touch panel. The filter 251 can be implemented according to the embodiments of FIGS. 3A-3C, 4A-4C, 5A-5B, 6A-6B, 7A-7B and 8A-8D according to an actual application requirement.

The resistance value of the resistor unit and the capacitance value of the capacitor unit in the filter 251 are all preset when the devices are manufactured, namely, each of the switches in the filter 251 has a predetermined turn on or turn off state when the switch is manufactured. However, the chip 200 may have various application environments after it is manufactured, and the preset resistance value and the capacitance value are not necessarily applicable; therefore, an application test of the chip 200 can be carried out before the chip 200 leaves the factory, so as to determined suitable resistance value/capacitance value according to a test result. For example, in the application test of the chip 200, a recognition error rate of the differential signal 240 is measured, or an oscilloscope is used to inspect the quality of the differential signal 240 received from the input terminals 221 and 222, so as to determine whether the preset resistance value and the capacitance value of the filter 251 are applicable, and if not, a suitable control value may be inputted through the input device 260 to adjust the resistance value and the capacitance value of the filter 251.

Figure 10:
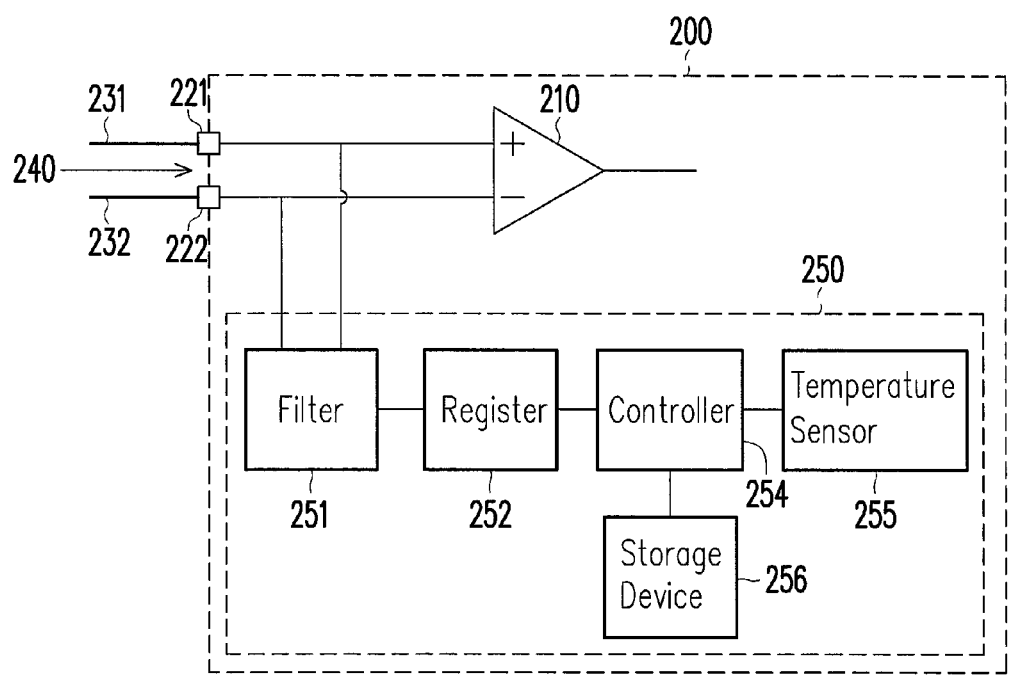

FIG. 10 is a schematic diagram of the de-noise circuit 250 according to another embodiment of the invention. The de-noise circuit 250 of FIG. 10 is another variation of the de-noise circuit 250 of FIG. 2, and besides the filter 251 and the register 252, the de-noise circuit 250 further includes a controller 254, a temperature sensor 255 and a storage device 256. The controller 254, the temperature sensor 255 and the storage device 256 are all disposed in the internal of the chip 200. The controller 254 is coupled to the register 252, the temperature sensor 255 and the storage device 256. The temperature sensor 255 may sense a current temperature of the chip 200. The controller 254 can obtain a corresponding value of the current temperature of the chip 200 according to a predetermined lookup table, and sends the corresponding value to the register 252 to serve as the control value, and the register 252 receives and stores the control value.

Under different temperatures, the source and the properties of the noise are variable, so that the filter 251 probably requires different resistance values and capacitance values under different temperatures. The aforementioned lookup table can be stored in the storage device 256. The lookup table may include a plurality of predetermined temperatures and corresponding values of the predetermined temperatures, where the corresponding value of each of the predetermined temperatures is the optimal control value under such temperature. If the current temperature output by the temperature sensor 255 is one of the predetermined temperatures recorded by the lookup table, the controller 254 can directly send the corresponding value of the current temperature to the register 252 to serve as the control value. If the current temperature output by the temperature sensor 255 is not one of the predetermined temperatures recorded by the lookup table, the controller 254 can obtain the corresponding value of the current temperature by performing an interpolation operation on a plurality of the predetermined temperatures closest to the current temperature and the corresponding values of the predetermined temperatures in the lookup table, and then send the corresponding value of the current temperature to the register 252 to serve as the control value. Therefore, within a normal operation range of the chip 200, the resistance value and the capacitance value of the filter 251 can be optimised regardless how the environment temperature of the chip 200 varies, so as to filter the noise in the differential signal.

The lookup table can be stored in the storage device 256, or can be directly stored in the controller 254. If the lookup table is directly stored in the controller 254, the storage device 256 can be omitted.

Figure 11:
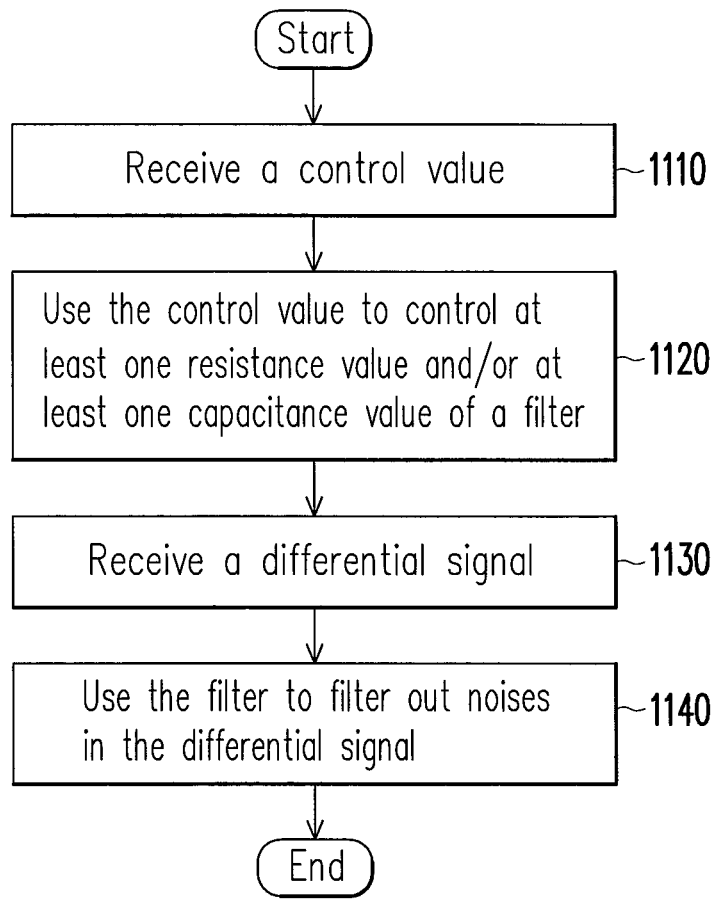
FIG. 11 is a flowchart illustrating a de-noise method according to an embodiment of the invention.

FIG. 11 is a flowchart illustrating a de-noise method according to an embodiment of the invention. The de-noise method of FIG. 11 can be executed by the de-noise circuit 250 of the aforementioned embodiments, or executed by other similar hardware, firmware or software. First, in step 1110, a control value is received. The control value may come from the input signal from the input device as that shown in FIG. 9, or come from the current temperature of the chip and the aforementioned lookup table as that shown in FIG. 10.

Then, in step 1120, the control value is used to control at least one resistance value and/or at least one capacitance value of a filter in a chip. As described above, each resistance value of the filter is provided by at least one resistor, each capacitance value of the filter is provided by at least one capacitor, and each bit of the control value controls whether one of the resistors and the capacitors is enabled or disabled through a corresponding switch.

Then, in step 1130, a differential signal is received, and in step 1140, the filter is used to filter out noises in the differential signal. Now, the flowchart of FIG. 11 is ended.

In summary, the interference noises unpredictably occurring within the chip can be filtered, by which the quality and recognizability of the input differential signal are improved, which facilitate converting the differential signal into a logic signal for outputting to a next stage. According to the invention, the problems of data loss and data error occurred in data transmission and system failure caused by noise interference can be effectively prevented, and a differential skew can be increased to increase the recognizability of the input differential signal of the chip, so as to reduce a chance of erroneous operation to ensure integrity of transmitted data and system stability.

In the invention, the resistance value and the capacitance value of the filter can be adjusted by only changing the control value without unplugging or welding the resistors and the capacitors in the hardware circuit, which has high efficiency and flexibility. Since the adjustment is easy, the resistance values and the capacitor values suitable for different application environments can be quickly found, which enhances stability of the system and reduces technical supports required to be provided to the clients by the chip supplier.

The above de-noise circuit and de-noise method are not only applied to the differential signal input of the differential amplifier, but can also be applied to differential signals received by various chips and the transmission lines of the differential signals, for example, the differential signals received by controls chips of universal serial bus (USB) devices, USB hubs and USB hosts that support a USB standard and the transmission lines thereof. Moreover, any specification capable of using the differential signal input such as low-voltage differential signalling (LVDS), peripheral component interconnect express (PCIE), PCIE II, serial AT attachment (SATA), SATA II, SATA III, Hypertransport, 10 Gigabit Ethernet, etc., or applications of transmitting high quality video/audio signals, etc. can all use the concept of the invention to filter out noises in the differential signals.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

The invention claimed is:

1. A de-noise circuit for differential signals, comprising:
a filter, disposed in a chip, and coupled between a first input terminal and a second input terminal of the chip, wherein the filter receives a differential signal to filter out noises in the differential signal, the filter comprises at least one filter unit, and each said filter unit has at least one resistance value or at least one capacitance value, one said filter unit is coupled between the first input terminal and the second input terminal, and filter devices of the one said filter unit are all resistors or all capacitors; and
a register, disposed in the chip to store a control value, wherein the control value is configured to control the resistance value or the capacitance value of the at least one filter unit.

2. The de-noise circuit for differential signals as claimed in claim 1, wherein the differential signal is respectively transmitted to the first input terminal and the second input terminal through a first transmission line and a second transmission line respectively, an input impedance of the filter at the first input terminal is equal to an impedance of the first transmission line, and an input impedance of the filter at the second input terminal is equal to an impedance of the second transmission line.

3. The de-noise circuit for differential signals as claimed in claim 1, wherein each of the filter units comprises the filter devices or a filter device branch circuit or a plurality of filter device branch circuits connected in parallel, each of the filter device branch circuits comprises the filter devices and a switch connected in series, and each of the filter devices is a resistor or a capacitor.

4. The de-noise circuit for differential signals as claimed in claim 3, wherein a bit of the control value controls a turn on state and a turn off state of each one of the switches of the filter unit.

5. The de-noise circuit for differential signals as claimed in claim 3, wherein the at least one filter unit comprises:
a first filter unit, coupled between the first input terminal and a node;
a second filter unit, coupled between the second input terminal and the node; and
a third filter unit, coupled between the node and a ground terminal, or coupled between the node and a reference voltage, wherein filter devices of the first filter unit and the second filter unit are all resistors and filter devices of the third filter unit are all capacitors, or filter devices of the first filter unit and the second filter unit are all capacitors and filter devices of the third filter unit are all resistors.

6. The de-noise circuit for differential signals as claimed in claim 3, wherein the at least one filter unit comprises:
a first filter unit, coupled between the first input terminal and a ground terminal; and
a second filter unit, coupled between the second input terminal and the ground terminal, wherein filter devices of the first filter unit and the second filter unit are all resistors or all capacitors.

7. The de-noise circuit for differential signals as claimed in claim 3, wherein the at least one filter unit comprises:
a first filter unit, coupled between the first input terminal and a reference voltage; and
a second filter unit, coupled between the second input terminal and the reference voltage, wherein filter devices of the first filter unit and the second filter unit are all resistors or all capacitors.

8. The de-noise circuit for differential signals as claimed in claim 1, further comprising:
a temperature sensor, disposed in the chip, and sensing a current temperature of the chip; and
a controller, disposed in the chip, coupled to the register and the temperature sensor, obtaining a corresponding value of the current temperature according to a lookup table, and transmitting the corresponding value to the register to serve as the control value, wherein the lookup table comprises a plurality of predetermined temperatures and corresponding values of the predetermined temperatures.

9. The de-noise circuit for differential signals as claimed in claim 1, further comprising:
a controller, coupled to the register and an input device, converting an input operation performed on the input device into the control value, and transmitting the control value to the register.

10. A de-noise method for differential signals, comprising:
receiving a control value;
using the control value to control at least one resistance value and/or at least one capacitance value of a filter in a chip, wherein a filter unit of the filter is coupled between two input terminals of the chip, and filter devices of the filter unit are all resistors or all capacitors;
receiving a differential signal; and
using the filter to filter out noises in the differential signal.

11. The de-noise method for differential signals as claimed in claim 10, further comprising:
sensing a current temperature of the chip; and
obtaining a corresponding value of the current temperature according to a lookup table to serve as the control value, wherein the lookup table comprises a plurality of predetermined temperatures and corresponding values of the predetermined temperatures.

12. The de-noise method for differential signals as claimed in claim 10, wherein each of the resistance values is provided by at least one resistor, each of the capacitance values is provided by at least one capacitor, and a bit of the control value controls whether one of the resistors and the capacitors is enabled or disabled.

13. The de-noise method for differential signals as claimed in claim 10, further comprising:
converting an input operation performed on an input device into the control value.

14. A chip for receiving differential signals, comprising:
a filter, disposed in the chip, receiving a differential signal and filtering out noises in the differential signal, wherein a filter unit of the filter is coupled between a first input terminal and a second input terminal of the chip, and filter devices of the filter unit are all resistors or all capacitors; and
a register, disposed in the chip, wherein the filter controls a filter parameter of the filter according to a control value stored in the register.

15. The chip as claimed in claim 14, further comprising:
a temperature sensor, disposed in the chip, and sensing a current temperature of the chip; and
a controller, disposed in the chip, generating the control value according to the current temperature, and sending the control value to the register.

16. The chip as claimed in claim 14, wherein the filter is coupled between the first input terminal and the second input terminal of the chip, and the differential signal is respectively transmitted to the first input terminal and the second input terminal of the chip through a first transmission line and a second transmission line respectively.

17. The chip as claimed in claim 14, wherein the filter comprises a plurality of filter units having adjustable filter parameters for adjusting input impedances of the filter at the first and second input terminals of the chip.

18. The chip as claimed in claim 14, further comprising:
a controller, coupled to the register and an input device, converting an input operation performed on the input device into the control value, and transmitting the control value to the register.

* * * * *